(12) United States Patent
Tanaka et al.

(10) Patent No.: US 8,943,963 B2
(45) Date of Patent: Feb. 3, 2015

(54) METHOD FOR PRODUCING METAL THIN FILM

(75) Inventors: Masanobu Tanaka, Kanagawa (JP); Hirotsugu Ishihara, Tokyo (JP); Toshiki Shimamura, Kanagawa (JP); Takahiro Kamei, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 13/233,581

(22) Filed: Sep. 15, 2011

(65) Prior Publication Data

US 2012/0000382 A1    Jan. 5, 2012

Related U.S. Application Data

(63) Continuation of application No. 12/157,473, filed on Jun. 11, 2008.

(30) Foreign Application Priority Data

Jun. 15, 2007    (JP) .................................. 2007-158341

(51) Int. Cl.
*B41F 1/00*    (2006.01)
*B41F 17/00*    (2006.01)

(52) U.S. Cl.
USPC .............................. 101/287; 101/41; 101/492

(58) Field of Classification Search
CPC ..... H05K 3/0008; H05K 3/12; H05K 3/1275; H05K 3/181; H05K 3/185; H05K 3/182; H05K 3/207; H05K 2203/0108; H05K 2203/0709; B41M 1/02; B41M 1/34; B41F 16/00; B41F 17/00; B41F 17/001; B41F 1/00; B41F 1/16; B41F 1/32

USPC ............ 101/40, 41, 42, 44, 33, 35, 492, 493, 101/368, 327, 287, 494
See application file for complete search history.

(56) References Cited

U.S. PATENT DOCUMENTS

| | | | |
|---|---|---|---|
| 4,098,184 A | 7/1978 | Okada et al. | |
| 4,981,750 A * | 1/1991 | Murphy et al. | 428/220 |
| 4,986,848 A | 1/1991 | Yamamoto et al. | |
| 5,272,980 A | 12/1993 | Takeuchi et al. | |
| 5,947,027 A | 9/1999 | Burgin et al. | |
| 6,235,093 B1 | 5/2001 | Okuhama et al. | |

(Continued)

FOREIGN PATENT DOCUMENTS

| | | |
|---|---|---|
| JP | 04-010974 A | 1/1992 |
| JP | 04-136917 A | 5/1992 |

(Continued)

*Primary Examiner* — Blake A Tankersley
(74) *Attorney, Agent, or Firm* — Wolf, Greenfield & Sacks, P.C.

(57) ABSTRACT

A method for producing a metal thin film on a substrate includes: a step of applying an ink to a flat blanket; a first transfer step of bringing the first blanket and a letterpress having a predetermined pattern of projections into contact by a pressure compression while the flat blanked and the letterpress being disposed opposite each other, to selectively transfer a portion of the ink on the flat blanket corresponding to the projections to the letterpress; a second transfer step of bringing the flat blanket obtained after the first transfer step and the substrate into contact by pressure compression while the flat blanket and the substrate being disposed opposite each other, to transfer the ink remaining on the flat blanket to the substrate; and a step of subjecting the substrate obtained after the second transfer step to electroless plating to deposit a metal thin film on the substrate.

13 Claims, 7 Drawing Sheets

(56) References Cited

U.S. PATENT DOCUMENTS

| | | | |
|---|---|---|---|
| 6,521,285 B1 | 2/2003 | Biebuyck et al. | |
| 6,736,886 B2 | 5/2004 | Suda et al. | |
| 6,843,852 B2 | 1/2005 | Dubin et al. | |
| 7,117,790 B2 * | 10/2006 | Kendale et al. | 101/327 |
| 7,735,419 B2 * | 6/2010 | Peterman | 101/368 |
| 2003/0047535 A1 | 3/2003 | Schueller et al. | |
| 2003/0159608 A1 * | 8/2003 | Heidari | 101/494 |
| 2004/0224252 A1 | 11/2004 | Kondo et al. | |
| 2005/0003101 A1 | 1/2005 | Damerell et al. | |
| 2005/0022745 A1 | 2/2005 | Nakano et al. | |
| 2005/0173049 A1 * | 8/2005 | Dona et al. | 156/230 |
| 2005/0263025 A1 | 12/2005 | Blees | |
| 2005/0285084 A1 | 12/2005 | Fujii et al. | |
| 2006/0236884 A1 | 10/2006 | Leenders et al. | |
| 2007/0000403 A1 | 1/2007 | Yoo et al. | |
| 2007/0114686 A1 * | 5/2007 | Choi et al. | 264/2.7 |
| 2008/0014362 A1 | 1/2008 | Kawamura et al. | |
| 2008/0202365 A1 | 8/2008 | Schneider et al. | |
| 2008/0307991 A1 | 12/2008 | Tanaka et al. | |
| 2009/0229856 A1 | 9/2009 | Fredenberg et al. | |
| 2012/0103222 A1 | 5/2012 | Tanaka et al. | |

FOREIGN PATENT DOCUMENTS

| | | | | |
|---|---|---|---|---|
| JP | 04-140186 | A | | 5/1992 |
| JP | 04-280495 | A | | 10/1992 |
| JP | 05-077394 | A | | 3/1993 |
| JP | 10-173317 | A | | 6/1998 |
| JP | 2001-219639 | A | | 8/2001 |
| JP | 2002-221802 | A | | 8/2002 |
| JP | 2003-502507 | T | | 1/2003 |
| JP | 2003-288812 | A | | 10/2003 |
| JP | 2005-101243 | A | | 4/2005 |
| JP | 2005-116745 | A | | 4/2005 |
| JP | 2005-213576 | A | | 8/2005 |
| JP | 2006091389 | A | * | 4/2006 |
| JP | 2006-269599 | A | | 10/2006 |
| JP | 2006-278845 | A | | 10/2006 |
| JP | 2006278845 | A | * | 10/2006 |
| JP | 2007-062302 | A | | 3/2007 |
| JP | 2007-134368 | A | | 5/2007 |
| WO | WO 2005/073431 | A1 | | 8/2005 |
| WO | WO 2006117745 | A2 | * | 11/2006 |

* cited by examiner

METHOD FOR PRODUCING METAL THIN FILM

CROSS-REFERENCE TO RELATED APPLICATIONS

This application is a continuation of U.S. application Ser. No. 12/157,473, filed Jun. 11, 2008, and entitled "Method for Producing Metal Thin Film." This application also claims the benefit of priority of Japanese patent application number 2007-158341, filed in the Japanese Patent Office on Jun. 15, 2007, which is hereby incorporated by reference to the maximum extent allowable by law.

BACKGROUND OF THE INVENTION

1. Field of the Invention

The present invention relates to a method for producing a metal thin film using a reverse offset printing method.

2. Description of Related Art

Some methods for producing a thin film pattern utilizing a reverse offset printing method have been proposed (for example, Patent Unexamined Patent Application Publication No. 11-58921 (hereinafter referred to as "Patent Document 1" and Patent Unexamined Patent Application Publication No. 2006-278845 (hereinafter referred to as "Patent Document 2")).

In the Patent Document 1, a method is proposed in which a desired resin thin film pattern is formed on a substrate by a reverse offset printing method using a cylindrical blanket comprising a cylindrical roll having a silicone resin formed thereon and using a letterpress having formed a desired pattern.

In the Patent Document 2, a method is proposed in which a desired conductive thin film pattern is formed on a substrate by a reverse offset printing method using an ink including conductive fine particles (having an average particle size of 50 nm or less) mixed into a water-soluble resin (polyethylene oxide).

SUMMARY OF THE INVENTION

In the Patent Document 1, a cylindrical blanket is used in the reverse offset printing. Consequently, it is difficult to keep uniform the contact pressure of the cylindrical blanket to the whole of a substrate which is flat during the transfer to the substrate, and a portion of the pattern becomes illegible. In addition, in bringing the cylindrical blanket and the flat substrate into contact, the alignment of them is not easy. Thus, the yield in producing a thin film is lowered.

Further, in the Patent Document 1, a resin thin film to be used mainly as an etching resist is formed on a substrate, and, for producing, e.g., a conductive thin film (metal thin film) on a substrate, a metal thin film is deposited on the entire surface of the substrate and then a resin ink is printed thereon, and further a step of removing the resin ink by etching so that the resin ink has a predetermined pattern is required, thus increasing the number of steps.

On the other hand, in the Patent Document 2, conductive fine particles are mixed into the ink, and a conductive thin film is directly formed on a substrate using the conductive fine particles. Further, in the Patent Document 2, the shape of the blanket is not limited to the cylindrical, and it is considered that a flat blanket may be applied to the method.

However, in the Patent Document 2, as described above, a resin (water-soluble resin) is also contained in the ink, and the resultant conductive thin film has a resistance larger than the resistance of a thin film composed solely of conductive fine particles. Further, the ink is a mixture of the conductive fine particles and resin, and hence the ink applied to the blanket has an increased thickness, making it difficult to achieve a scaled-down pattern.

Accordingly, it is desirable to provide a method for producing a metal thin film, which achieves a finer pattern and a higher yield than those obtained by a known method without unnecessarily increasing the resistance of the thin film.

In accordance with an embodiment of the present invention, there is provided a method for producing a metal thin film including the following requirements (A) to (E):

(A) an application step of applying an ink to a flat blanket;

(B) a first transfer step of bringing the flat blanket and a letterpress having a predetermined pattern of projections into contact by a pressure compression while the flat blanket and the letter press being disposed opposite each other, to selectively transfer a portion of the ink on the flat blanket corresponding to the projections to the letterpress;

(C) a second transfer step of bringing the flat blanket obtained after the first transfer step and the substrate into contact by a pressure compression while the flat blanket and the substrate being disposed opposite each other, to transfer the ink remaining on the flat blanket to the substrate;

(D) a plating step of subjecting the substrate obtained after the second transfer step to electroless plating to deposit a metal thin film on the substrate; and (E) the ink including a catalyst material for the electroless plating is used.

In the method for producing a metal thin film of an embodiment of the present invention, the substrate to which the ink including a catalyst material is transferred is subjected to electroless plating. As a result, in the plating step, a metal thin film is selectively formed on the substrate in a region to which the ink is transferred. The ink is transferred to the substrate using a flat blanket, and further the substrate and the flat blanket are in contact by pressure compression in the transfer step. Accordingly, the letterpress or substrate and the blanket are easy to align and the whole pressure for the contact of them is uniform. Further, the ink does not contain a material for the metal thin film but a catalyst material for the electroless plating. As a result, the resultant metal thin film has a low resistance, as compared to a conventional metal thin film formed using an ink containing a material for the metal thin film and a resin, and further the ink applied to the flat blanket has a reduced thickness, thus making it easy to achieve a scaled-down pattern.

The above summary of the present invention is not intended to describe each illustrated embodiment or every implementation of the present invention. The figures and the detailed description which follow more particularly exemplify these embodiments.

DETAILED DESCRIPTION OF EMBODIMENTS

Hereinbelow, embodiments of the present invention will be described in detail with reference to the accompanying drawings.

Figure 2A:
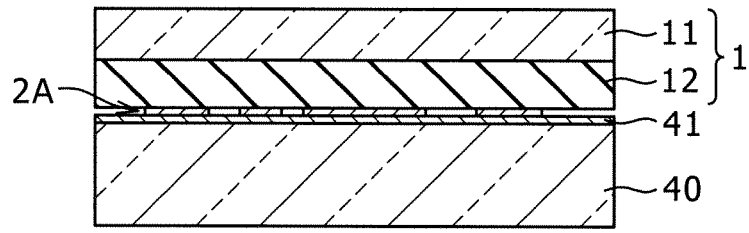
FIGS. 2A to 2C are cross-sectional views showing steps subsequent to FIG. 1C.
Figure 2B:
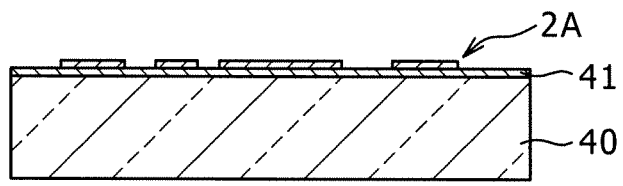
Figure 2C:
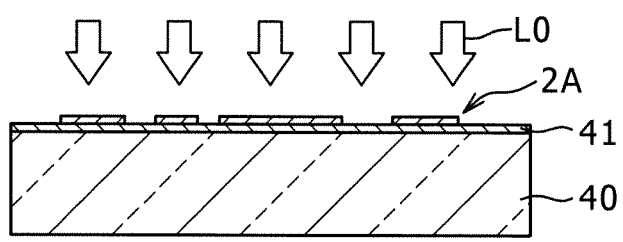
Figure 3:
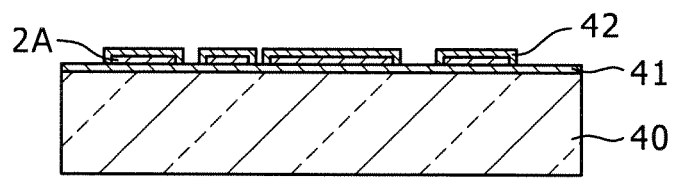
FIG. 3 is a cross-sectional view showing a step subsequent to FIG. 2C.

FIGS. 1 to 3 are cross-sectional views for explaining a method for producing a metal thin film according to one embodiment of the present invention.

Figure 1A:
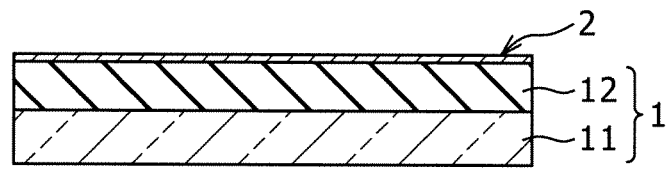
FIGS. 1A to 1C are cross-sectional views showing part of the principal steps in a method for producing a metal thin film according to one embodiment of the present invention.

First, as shown in FIG. 1A, an ink 2 is applied to a flat blanket 1. The flat blanket 1 includes a rigid base 11 composed of a glass plate, a metal plate, or the like, and a polydimethylsiloxane (PDMS) layer 12 on the base 11. An ink is applied to the PDMS layer 12. By forming the flexible PDMS layer on the rigid base 11, the accuracy in the plane direction is improved and the transfer pressure is reduced. It is preferable that the base 11 has a thickness of about 10 to 500 μm and the PDMS layer 12 has a thickness of 1 to 5,000 μm.

With respect to the ink 2, an ink including a catalyst material which serves as a catalyst for the below-mentioned electroless plating and being suitable for the printing method (reverse offset printing method) is used. Specifically, it is preferable that the ink 2 contains, as a solute, a metal compound or metal fine particles (metal nanoparticles) which is the catalyst material, and that the ink 2 contains, as a solvent, a nonpolar solvent having a boiling point of 100° C. or lower and having a contact angle of 10° or less on the PDMS layer 12, which is described in detail below. The solute and the solvent are mixed together to form the ink 2. It is preferable that the ink 2 has a concentration of 0.01 to 30% by weight, but the concentration of the ink is not limited to this range.

With respect to the metal compound, there may be used a compound of a metal, such as gold (Au), silver (Ag), or palladium (Pd), having bonded thereto at least one organic compound selected from a linear fatty acid represented by the molecular formula: $C_nH_mCOOH$, a linear alkylamine represented by the molecular formula: $CH_3(CH_2)_nNH_2$, a linear alkylthiol represented by the molecular formula: $CH_3(CH_2)_nSH$, and a linear alkylnitrile represented by the molecular formula: $CH_3(CH_2)_nCN$. In these molecular formulae, it is preferable that n is an integer of 5 to 40 and m satisfies: m=2n+1.

With respect to the metal nanoparticles, fine particles (desirably having an average particle size of 0.1 to 20 nm) of a metal, such as Au, Ag, or Pd, may be used, and fine particles having their surfaces covered with a protective agent composed of an organic compound are desirably used. The protective agent enables the metal nanoparticles to be stably stored. With respect to the protective agent, there may be used one having bonded at least one organic compound selected from a linear alkylamine represented by the molecular formula: $CH_3(CH_2)_nNH_2$, a linear alkylthiol represented by the molecular formula: $CH_3(CH_2)_nSH$, and a linear alkylnitrile represented by the molecular formula: $CH_3(CH_2)_nCN$. In these molecular formulae, it is preferable that n is an integer of 5 to 40 and m satisfies: m=2n+1.

With respect to the solvent of the ink 2, as described above, a nonpolar solvent having a boiling point of 100° C. or lower and having a contact angle of 10° or less on the PDMS layer 12 is preferable. When the solvent having a boiling point of 100° C. or lower is used, almost all the solvent is evaporated during the application of the ink 2 or after completion of the application, so that only the solute, which serves as a catalyst for the electroless plating, remains on the flat blanket 1. Examples of the solvents include hydrocarbons, e.g., linear alkanes, such as pentane, hexane, and heptane, cycloalkanes, such as cyclopentane and cyclohexane, and ethers, such as ethyl methyl ether, diethyl ether, and tetrahydrofuran.

With respect to the method for applying the ink 2 to the flat blanket 1, for example, a spin coating method, a spraying method, a CAP coating method, a slit coating method, an LB film producing method, or an inkjet method is preferred.

Figure 1B:
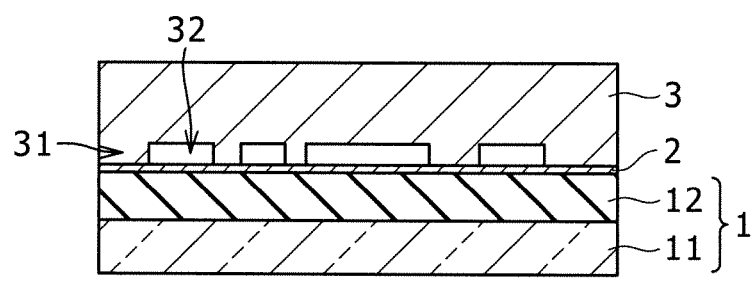

Subsequently, as shown in FIG. 1B, the flat blanket 1 and a letterpress 3 having a predetermined pattern of projections are disposed opposite to each other, and are brought into contact to selectively transfer a portion of the ink 2 on the flat blanket 1 corresponding to the projection 31 to the letterpress 3.

The letterpress 3, which is composed of quartz, glass, a resin, a metal, or the like and which has depressions 32 each having a depth of about 0.1 to 10 μm formed using, e.g., a photolithography method and an etching method, is desirably used. As described below, a pattern to be formed to letterpress 3 is configured in such a manner that the depressions 32 corresponds to a region in which a metal thin film (metal wiring) is formed.

To bring the flat blanket 1 and the letterpress 3 into contact, they are contacted by pressure compression (using a compressed gas pressure method). The compressed gas pressure method is a method in which the flat blanket 1 and letterpress 3 to be in contact are disposed opposite and close to each other and fixed to predetermined stages, and compressed gas is injected from the back side of one of the flat blanket 1 and the letterpress 3 to push it, bringing the flat blanket 1 and letterpress 3 into contact. In this instance, a space defined by the object to be push and the stage as a source of the compressed gas is closed (space indicated by an arrow P1 in FIGS. 4A and 4B or space indicated by an arrow P4 in FIG. 5).

Figure 4A:
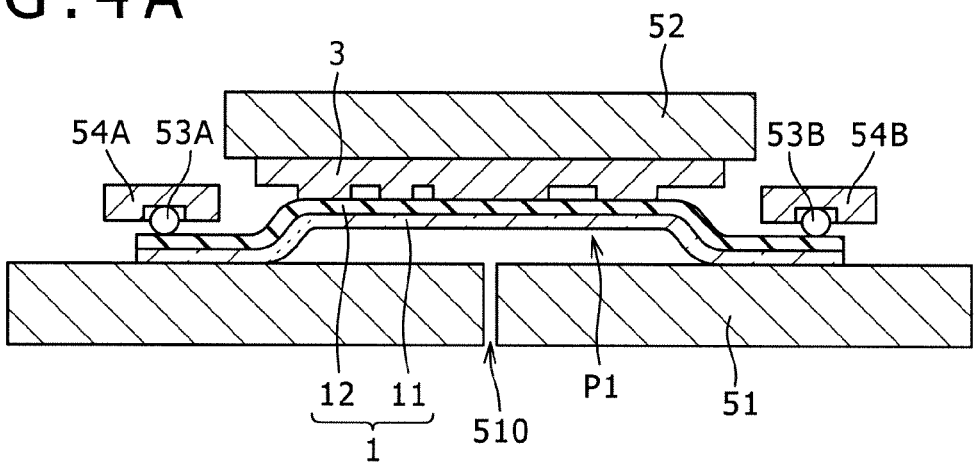
FIGS. 4A and 4B are cross-sectional views showing an example of a method for bringing the flat blanket and the letterpress into contact.
Figure 4B:
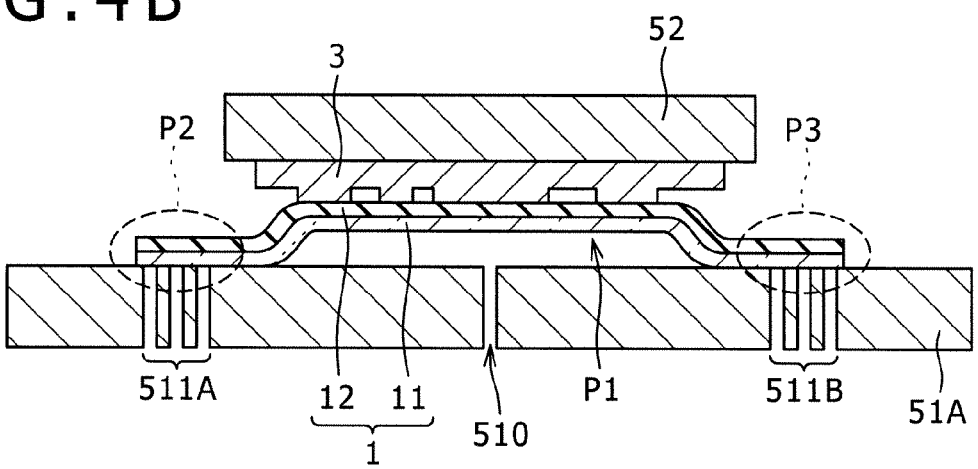
Figure 5:
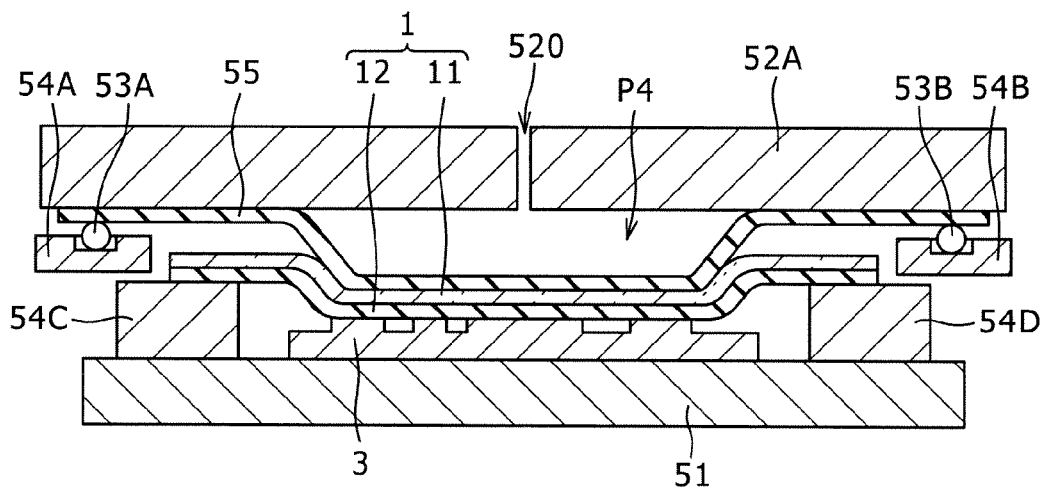
FIG. 5 is a cross-sectional view showing another example of a method for bringing the flat blanket and the letterpress into contact.

Specifically, for example, as shown in FIG. 4A, the outer edge of the flat blanket 1 is mechanically fixed by a lower stage 51, O-rings 53A, 53B, and stationary frames 54A, 54B, and further the letterpress 3 is fixed by an upper stage 52, and compressed gas is injected through an opening 510 (which functions as a vacuum port and a compressed gas inlet) formed around the center of the lower stage 51 to push the flat blanket 1. Alternatively, for example, as shown in FIG. 4B, the outer edge of the flat blanket 1 may be fixed by vacuum suction, as indicated by reference characters P2, P3, through openings 511A, 511B formed in a lower stage 51A. Further alternatively, for example, as shown in FIG. 5, the letterpress 3 is fixed to a lower stage 51 and the outer edge of the flat blanket 1 is fixed by stationary frames 54C, 54D, and further an expandable and stretchable film 55 having flexibility is fixed by O-rings 53A, 53B, stationary frames 54A, 54B, and an upper stage 52A, and compressed gas is injected through an opening 520 (which functions as a vacuum port and a compressed gas inlet) formed around the center of the upper stage 52A to push the stretchable film 55 and flat blanket 1. In this case, the outer edge of the flat blanket 1 is just mechanically fixed. In the above cases, the distance between the flat blanket 1 and the letterpress 3 is 1 μm to 1 mm, and the transfer pressure is precisely controlled to be about 0.1 to 100 kPa. Thus the pressure on the flat blanket 1 can be controlled to be uniform and low, enabling transfer of the ink 2 free of batter. In FIGS. 4 to 11 including FIGS. 4 and 5, the inks 2, 2A, 2B are not shown.

Figure 1C:
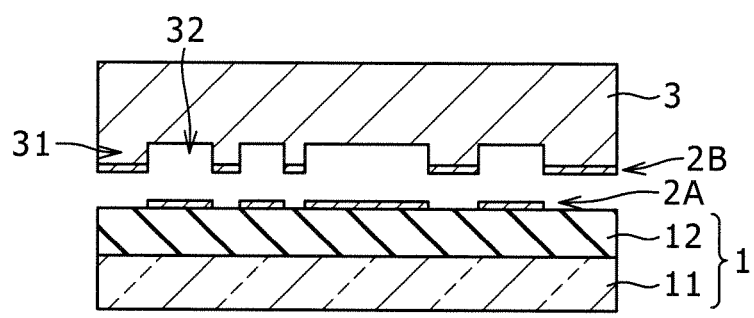
Figure 6:
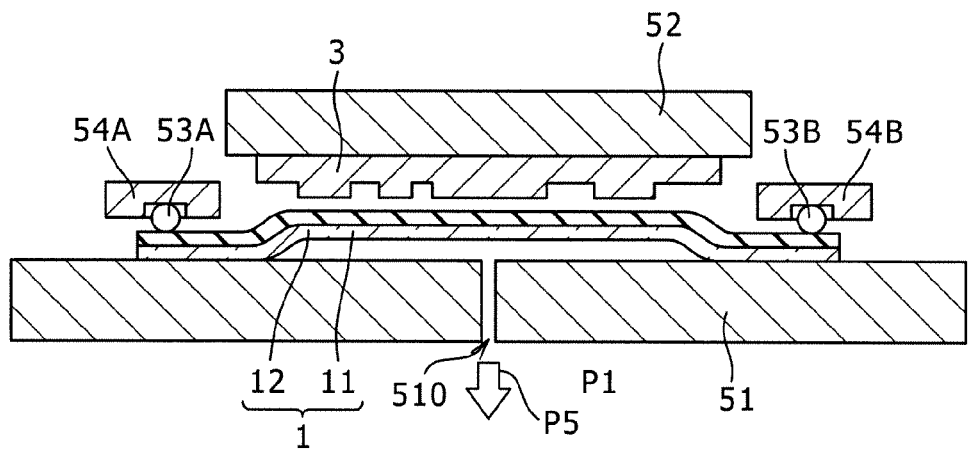
FIG. 6 is a cross-sectional view showing an example of a method for separating the flat blanket and the letterpress.
Figure 7:
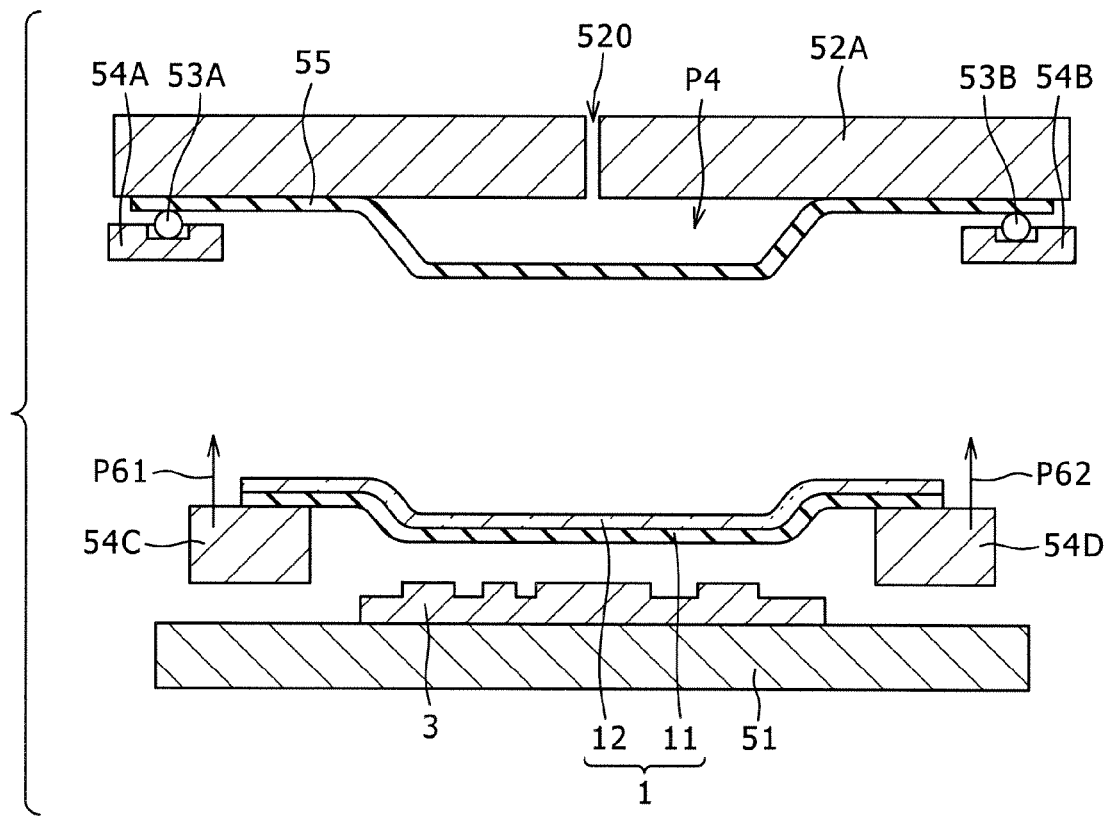
FIG. 7 is a cross-sectional view showing another example of a method for separating the flat blanket and the letterpress.

Subsequently, as shown in FIG. 1C, the flat blanket 1 and letterpress 3 brought into contact each other are separated. As a result, the ink remains on the flat blanket 1 in a region to which the ink is not transferred by the letterpress 3 (portion of the ink 2A shown in the figure) to form a pattern of the metal thin film (metal wiring) described later. On the other hand, the ink is transferred to the projection 31 of the letterpress 3 (portion of the ink 2B shown in the figure). Examples of methods for separating the flat blanket 1 and the letterpress 3 include a method in which, for example, as shown in FIG. 6, the flat blanket and the letterpress are separated by creating a vacuum in the space P1 by evacuation through the opening 510 (see an arrow P5 shown in the figure) to allow the flat blanket 1 to adsorb onto the lower stage 51, and a method in which, for example, as shown in FIG. 7, the flat blanket and the letterpress are mechanically separated by moving upward the outer edge of the flat blanket 1 (see arrows P61, P62 shown in the figure).

Subsequently, as shown in FIG. 2A, the flat blanket 1 to which the ink 2A has been transferred and a substrate (substrate 40) on which a metal thin film will be formed are disposed opposite to each other and brought into contact to transfer the ink 2A remaining on the flat blanket 1 to the substrate 40.

With respect to the substrate 40, a substrate composed of a material such as silicone, synthetic quartz, glass, a metal, a resin, or a resin film, is used. It is preferable that the substrate 40 includes an adhesion layer 41 formed thereon so that the ink 2A is transferred to the adhesion layer 41 because the ink 2A is easy to bond. Examples of materials for the adhesion layer 41, include materials including at least one compound selected from an amino silane compound, a mercapto silane compound, a phenyl silane compound, and an alkyl silane compound. The adhesion layer 41 may be formed on the substrate 40 using a spin coating method, a dipping method, a thermal chemical vapor deposition (CVD) method, or the like.

Figure 8A:
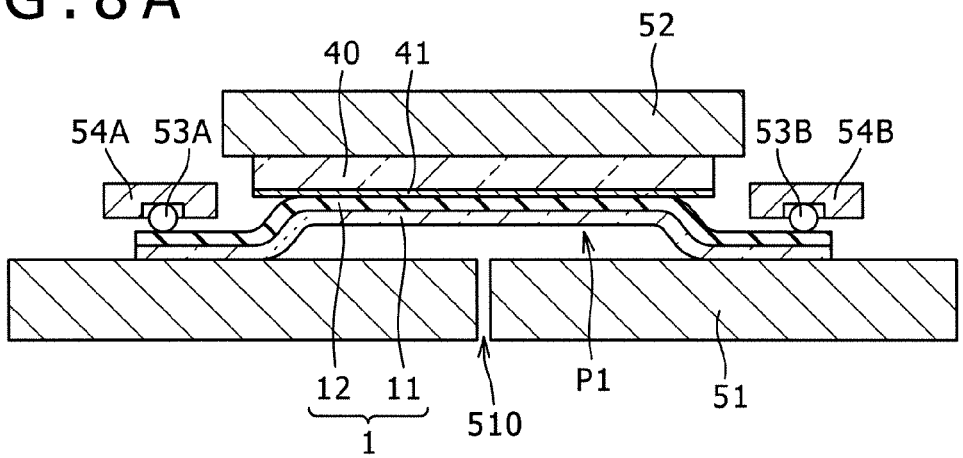
FIGS. 8A and 8B are cross-sectional views showing an example of a method for bringing the flat blanket and the substrate into contact.
Figure 8B:
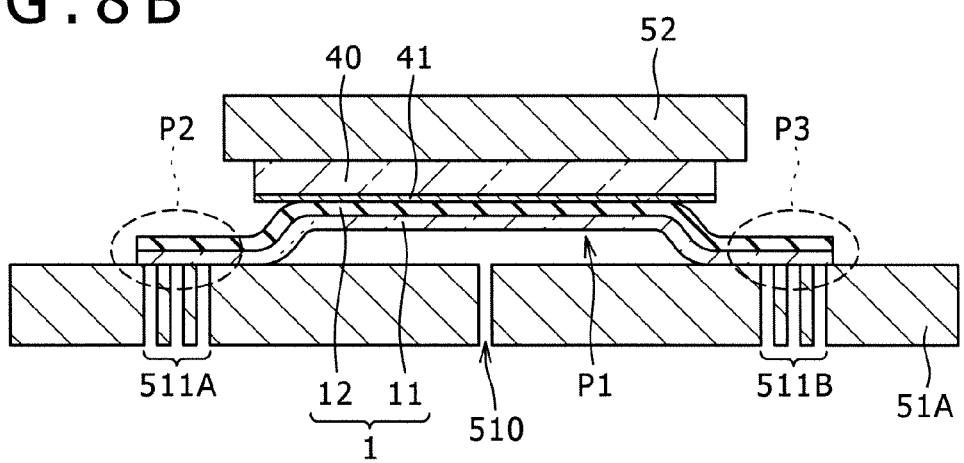
Figure 9:
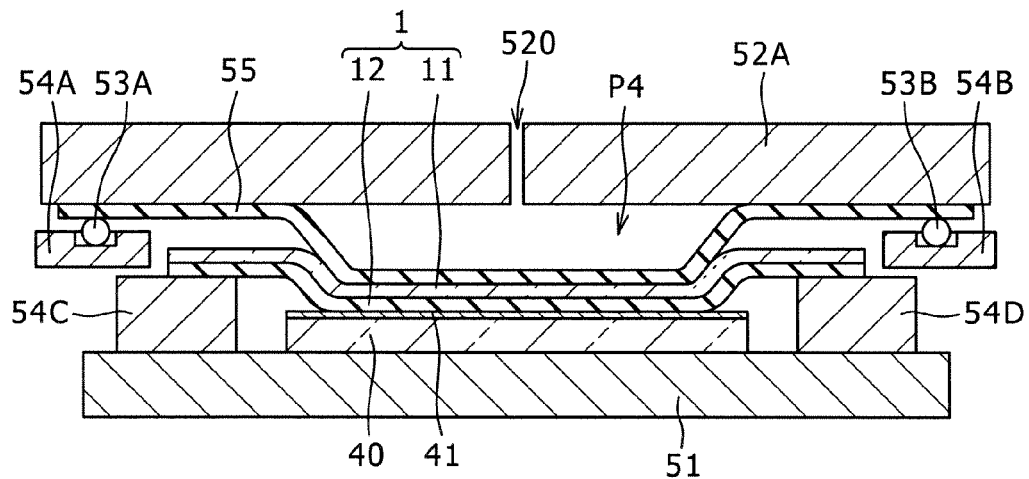
FIG. 9 is a cross-sectional view showing another example of a method for bringing the flat blanket and the substrate into contact.

To bring the flat blanket 1 and the substrate 40 into contact, they are contacted by pressure compression (using a compressed gas pressure method) as described above. Specifically, for example, as shown in FIG. 8A, the outer edge of the flat blanket 1 is mechanically fixed by a lower stage 51, O-rings 53A, 532, and stationary frames 54A, 54B, and further the substrate 40 is fixed by an upper stage 52, and compressed gas is injected through an opening 510 (which functions as a vacuum port and a compressed gas inlet) formed around the center of the lower stage 51 to push the flat blanket 1. Alternatively, for example, as shown in FIG. 8B, the outer edge of the flat blanket 1 may be fixed by vacuum suction, as indicated by reference characters P2, P3, through openings 511A, 511B formed in a lower stage 51A. Further alternatively, for example, as shown in FIG. 9, the substrate 40 is fixed to a lower stage 51 and the outer edge of the flat blanket 1 is fixed by stationary frames 54C, 54D, and further a stretchable film 55 is fixed by O-rings 53A, 53B, stationary frames 54A, 54B, and an upper stage 52A, and compressed gas is injected through an opening 520 (which functions as a vacuum port and a compressed gas inlet) formed around the center of the upper stage 52A to push the stretchable film 55 and flat blanket 1. In this case, the outer edge of the flat blanket 1 is just mechanically fixed. In the above cases, the distance between the flat blanket 1 and the substrate 40 is 1 μm to 1 mm, and the transfer pressure is precisely controlled to be about 0.1 to 100 kPa. Thus the pressure on the flat blanket 1 can be controlled to be uniform and low, enabling transfer of the ink 2A free of batter.

It is preferable that a predetermined alignment mark is formed on the substrate 40 and the substrate 40 and the flat blanket 1 are aligned (alignment) using the alignment mark in bringing the flat blanket 1 and substrate 40 into contact to transfer the ink 2A. This is because the alignment can be easily improved in accuracy.

Figure 10A:
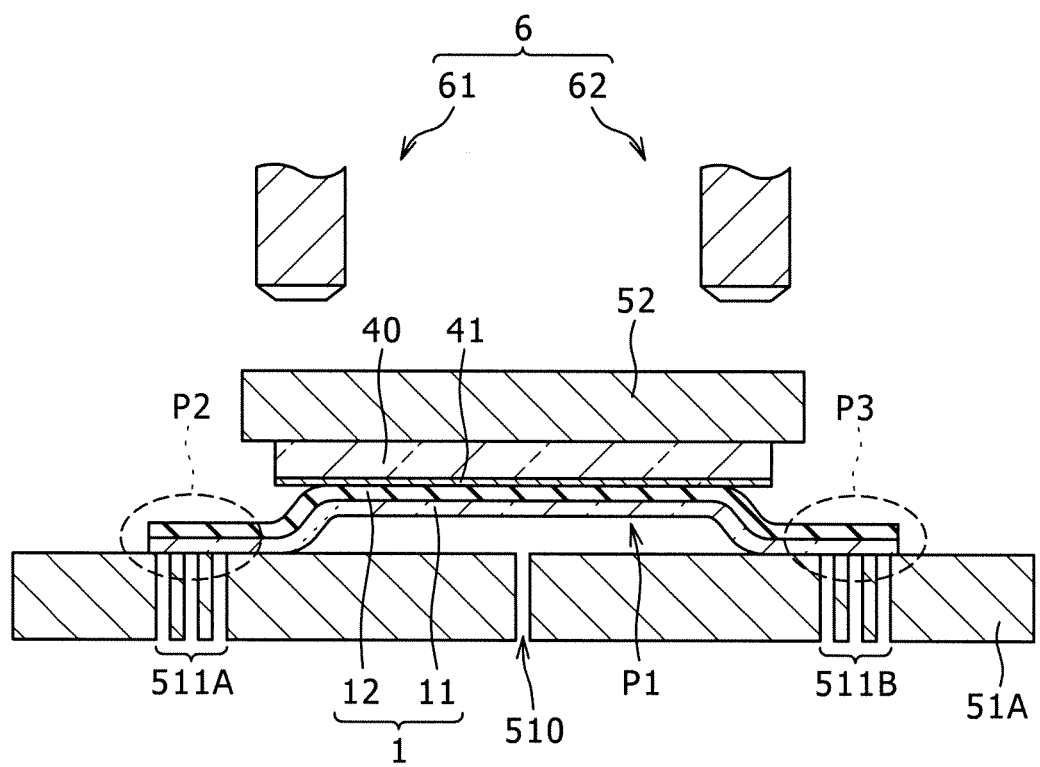
FIGS. 10A and 10B are a cross-sectional view and a plan view showing an example of a method for alignment in bringing the flat blanket and the substrate into contact.
Figure 10B:
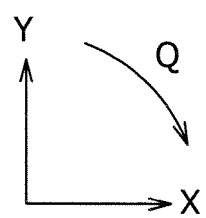

Specifically, for example, as shown in FIG. 10A, an alignment mark (not shown) formed by the ink 2A on the flat blanket 1 and an alignment mark (not shown) preliminarily formed on the substrate 40 are compared using an alignment microscope 6 (61, 62) to adjust the X, Y, θ coordinates (see FIG. 10B), making an alignment. Therefore, for example, as shown in FIG. 10B, the transfer apparatus has a control mechanism for the X, Y, θ coordinates in one of the upper and lower stages 51, 52. If the distance between the flat blanket 1 and the substrate 40 is large (for example, 30 μm or larger), the alignment microscope 6 lacks the focal depth, making it difficult to put together the alignment marks. Accordingly, in such a case, it is preferable that the apparatus has a multifocal alignment mechanism having an image recording function.

Figure 11A:
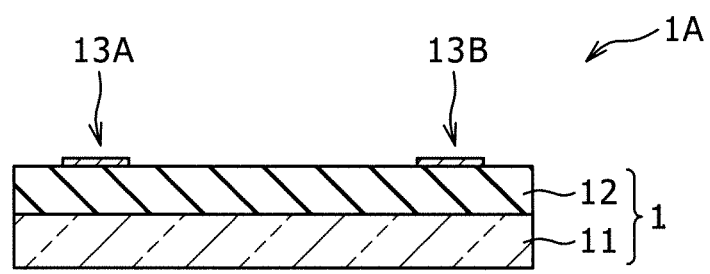
FIGS. 11A and 11B are cross-sectional views showing examples of flat blankets having formed alignment marks.
Figure 11B:
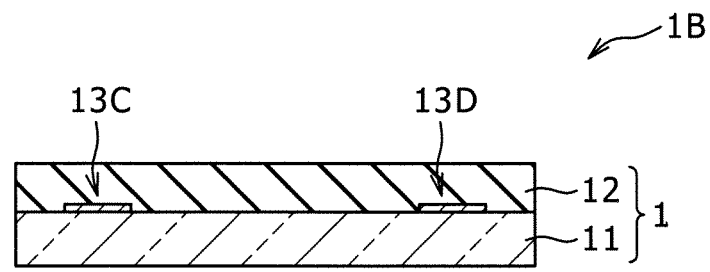

If the thickness of the ink 2A is too small to observe the alignment mark of the ink 2A using the alignment microscope 6, it is preferable that, for example, shown in a flat blanket 1A or 1B of FIG. 11A or 11B, alignment marks 13A, 13B are preliminarily formed on the PDMS film 12 or alignment marks 13C, 13D are formed in advance on the base 11. Since the PDMS film 12 is transparent, the alignment marks 13C, 13D can be recognized in the case of FIG. 11B. In these cases, a first alignment in which the flat blanket 1 and the letterpress 3 are aligned is performed and the ink is transferred to determine the relationship in position between the alignment mark on the flat blanket 1 and the ink pattern, and then a second alignment in which the flat blanket 1 and the substrate 40 are aligned is performed and the ink is transferred.

Subsequently, as shown in FIG. 2B, the flat blanket 1 and substrate 40 bought into contact each other are separated. As a result, the whole of ink 2A on the flat blanket 1 is transferred to the substrate 40 (adhesion layer 41) to form a pattern of the metal thin film (metal wiring) described later, and, on the other hand, no ink remains on the flat blanket 1. As examples of methods for separating the flat blanket 1 and the substrate 40, include the method as described above in which the flat blanket and the substrate are separated by creating a vacuum in the space P1 by evacuation through the opening 510 to allow the flat blanket 1 to adsorb onto the lower stage 51 and method in which the flat blanket and the substrate are mechanically separated by moving upward the outer edge of the flat blanket 1.

Subsequently, as shown in FIG. 2C, organic substances contained in the solvent of the ink 2A or the protective film for the metal nanoparticles are removed to activate the catalyst material for electroless plating (specifically, the solute of the ink 2A), thus promoting the electroless plating described later. The ink 2A containing a great amount of organic substances is likely to be inactive in the electroless plating, and therefore the organic substances are removed so that the ink fully exhibits catalytic activity. A treatment for the activation is made by, for example, an ultraviolet (UV) ozone treatment in which the ink 2A is irradiated with ultraviolet light L0 as shown in the figure, ozone water cleaning, or baking treatment. The UV ozone treatment or ozone water cleaning may be performed at a relatively low temperature (e.g., at about 0 to 200° C.). The baking treatment is performed at a relatively high temperature, e.g., at about 200 to 400° C. With respect to the baking treatment, when the ink 2A contains Pd as a solute (catalyst material), for preventing Pd from suffering oxidization, it is preferable that the baking treatment is performed in an oxygen free atmosphere, such as nitrogen gas ($N_2$) or argon (Ar).

Subsequently, the substrate 40 to which the ink 2A has been transferred is subjected to electroless plating to deposit a metal thin film 42 on the substrate 40 as shown in FIG. 3. Specifically, the metal thin film 42 is selectively formed on the substrate 40 in a region to which the ink 2A is transferred. In the electroless plating, the substrate 40 is immersed in a desired electroless plating solution to selectively deposit a metal on the substrate only in a region in which the ink 2A is present. In the electroless plating, various metals, such as nickel (Ni), copper (Cu), cobalt (Co), iron (Fe), Au, or Ag, can be deposited.

Finally, the metal thin film 42 deposited on the substrate 40 is annealed at about 100 to 1,000° C. In this case, the metal thin film 42 may be reduced in resistance, the stress may be relaxed during deposition of the metal thin film, the adhesion of the metal thin film may be improved, or metal oxidization may be prevented. For preventing the metal thin film 42 from suffering oxidization during the annealing, it is preferable that the annealing is performed in a vacuum or in an oxygen free atmosphere, such as $N_2$ or Ar.

Thus, the metal thin film (metal thin film 42) according to an embodiment of the present invention is produced.

In the method for producing a metal thin film (metal thin film 42) according to an embodiment of the present invention, the substrate 40 to which the ink 2A comprising a catalyst material has been transferred is subjected to electroless plating. As a result, the metal thin film 42 is selectively formed on the substrate 40 in a region to which the ink 2A is transferred.

The ink 2A is transferred to the substrate 40 using the flat blanket 1, and further the substrate and the flat blanket are in contact by pressure compression in the transfer step (steps shown in FIG. 1B and FIG. 2A) (using a compressed gas pressure method). As a result, the letterpress 3 or substrate 40 and the flat blanket 1 is easy to align and the whole pressure for the contact of them is uniform.

The ink 2 does not contain a material for the metal thin film 42 but a catalyst material for the electroless plating. Accordingly, the resultant metal thin film 42 has a low resistance, as compared to a known metal thin film formed using an ink containing a material for the metal thin film and a resin, and further the ink 2 applied to the flat blanket 1 has a reduced thickness, thus making it easy to achieve a scaled-down pattern.

As described above, according to an embodiment of the present invention, the substrate 40 to which the ink 2A comprising a catalyst material has been transferred is subjected to electroless plating. As a result, and the metal thin film 42 is selectively formed on the substrate 40 in a region to which the ink 2A is transferred. The ink 2 is transferred using the flat blanket 1, and further the substrate and the flat blanket are in contact by pressure compression in the transfer step. Consequently, the letterpress or substrate and the blanket is easy to align and the whole pressure for the contact of them is uniform, thus improving the yield in producing the metal thin film 42. Further, the ink 2 does not contain a material for the metal thin film 42 but a catalyst material for the electroless plating. Accordingly, the metal thin film 42 has a low resistance and the pattern can be easily scaled down, as compared to those obtained in a known method. Thus, a finer pattern and a higher yield than those obtained by a known method can be achieved without unnecessarily increasing the resistance of the thin film.

Since an activating step, in which the catalyst material is activated, includes between the transfer step of the ink 2A (step shown in FIG. 2A) and the plating step (step shown in FIG. 3), the electroless plating is promoted, so that the formation of the metal thin film 42 can be promoted.

When the substrate 40 and the flat blanket 1 individually have formed thereon alignment marks in advance and the substrate 40 and the flat blanket 1 are aligned using the alignment marks in the transfer step of the ink 2A, the alignment is easily improved in accuracy, and further the yield can be improved.

EXAMPLES

Hereinbelow, embodiments of the present invention will be described in more detail with reference to the following Examples.

Example 1

A metal thin film having a structure shown in FIG. 3 was formed as follows. Specifically, an ink 2 including a palladium (Pd) particle colloid, which is a metal compound corresponding to a catalyst material for the electroless plating, was prepared, and the ink 2 was printed on a substrate 40 by a reverse offset printing method, and then a Cu thin film was selectively deposited on the ink by Cu electroless plating to form a Cu wiring.

The ink 2 contained a Pd particle colloid {hydrophobic Pd decylamine (DA) colloid toluene solution, manufactured and sold by Tanaka Kikinzoku Kogyo} which is a metal compound corresponding to a catalyst material for the electroless plating, and the Pd particle colloid treated by the following procedure was used. The hydrophobic Pd DA colloid toluene solution was first adjusted in concentration to 1.0% by weight, and n-hexadecanethiol was added to the solution so that the concentration became 2.0% by weight, and the resultant mixture was heated at 80° C. for 12 hours while stirring. Then, the mixture was cooled to room temperature, and methanol was added to the mixture in an amount about 20 times the amount of the Pd DA colloid toluene solution to effect precipitation of Pd particles. Then, the resultant precipitates and solution were subjected to filtration using a 1 μm filter to recover the precipitates on the filter. In the precipitates, decylamine in part of the protective agent for the Pd particles is substituted by hexadecanethiol in the above treatment. The substitution ratio is 10 to 30% when decylamine is 100. By the above treatment, the Pd particles can be dissolved in hexane or pentane, in which the untreated Pd particles have a low solubility. The Pd particles were dispersed in an n-pentane solution so that the concentration became 1.0% by weight, and then used in the ink.

The flat blanket 1 having a polydimethylsiloxane (PDMS) layer 12 deposited (by a spin coating method) on glass (thickness: 0.2 mm; AF45, manufactured and sold by SCHOTT AG) as a base 11 was baked at 65° C. for 12 hours and then used. The PDMS layer 12 had a thickness of 60 μm. As the PDMS, SYLGARD184 (manufactured and sold by Dow Corning Toray Co., Ltd.) was diluted with toluene in a concentration of 80% by weight and then used.

First, in the application step of the ink 2 (FIG. 1A), the ink 2 was applied to the flat blanket 1 by a spin coating method.

Conditions for application at 3,000 rpm held for 20 seconds were employed, and the layer of the ink 2 had a thickness of 20 nm.

Next, in the first transfer step (FIG. 1B), the flat blanket 1 and a letterpress 3 were brought into contact using a compressed gas pressure method to selectively transfer to the letterpress 3 an ink 2B in the ink 2 corresponding to the projection 31. The letterpress 3 was composed of quartz glass. Specifically, a chromium (Cr) film having a thickness of about 200 nm was deposited on quartz glass by a vacuum evaporation method, and a predetermined pattern was formed in the resultant film by a photolithography method and a wet etching method, and the quartz glass was etched in about 1.0 µm by a dry etching method, and finally the Cr was removed by etching, thus preparing a letterpress 3 having projections 31 and depressions 32. In bringing the flat blanket 1 and the letterpress 3 into contact, as shown in FIG. 5, the flat blanket 1 was fixed by a lower stage 51 and stationary frames 54C, 54D, and the flat blanket 1 and the letterpress 3 were disposed opposite and parallel to each other with a distance of 1 mm between them, and then compressed air was injected from the back side of the flat blanket 1 (opening 520) to push the expanded film (stretchable film 55) made of a fluororesin, bringing the flat blanket and the letterpress into contact. The transfer pressure was 10 kPa, and the transfer time was 10 seconds.

Then, as shown in FIG. 10 and FIG. 7, the flat blanket 1 and the letterpress 3 were separated from each other by moving upward the stationary frames 54C, 54D.

Next, in the second transfer step (FIG. 2A), the flat blanket 1 and the substrate 40 were brought into contact using a compressed gas pressure method to transfer the ink 2A on the flat blanket 1 to the substrate 40. As a result, a pattern of the ink containing the Pd particle colloid was formed on the substrate 40. An adhesion layer 41 for bonding the ink 2A was formed on the substrate 40 in advance. As a material for the adhesion layer 41, 3-mercaptopropyltrimethoxysilane $\{HSC_3H_6Si(OCH_3)_3\}$, which is a mercapto silane compound, diluted with ethyl lactate in a concentration of 50 mmol/L was used. This compound was deposited on the substrate 40 composed of glass by a spin coating method and annealed at 120° C. for 30 minutes, and rinsed with ethanol by ultrasonic cleaning for 10 minutes and then used. The detailed conditions for the second transfer step are basically the same as the conditions for the first transfer step (FIG. 1B). Since there was no pattern preformed on the substrate 40 in the present Example, the flat blanket 1 and the substrate 40 were aligned by roughly putting together their centers with visual estimation.

Then, as shown in FIG. 2B, the flat blanket 1 and the substrate 40 were separated from each other by moving upward the stationary frames 54C, 54D.

Next, the substrate 40 was baked in an atmosphere of nitrogen gas at 200° C. for 5 minutes to decompose organic substances contained in the ink 2A, whereby the ink fully exhibited catalytic activity in the electroless plating.

Finally, the substrate 40 thus prepared was subjected to Cu electroless plating. As an electroless plating solution, OPC COPPER T, manufactured and sold by Okuno Chemical Industries Co., Ltd., was used. Thus, a Cu wiring composed of a Cu thin film having a thickness of 500 nm was formed. The wiring had a fineness of 5 µm/5 µm in terms of a line/space.

Example 2

A metal thin film was formed in substantially the same manner as in Example 1 except for the items shown below.

Specifically, an ink 2 including Pd nanoparticles (protective agent: $C_{16}H_{33}SH$), which are metal nanoparticles corresponding to a catalyst material for the electroless plating, was prepared, and the ink 2 was printed on a substrate 40 by a reverse offset printing method, and then an Ni thin film was selectively deposited on the ink by Ni electroless plating to form an Ni wiring.

The ink 2 contained Pd nanoparticles (protective agent: $C_{16}H_{33}SH$) having an average particle size of 8 nm, which are metal nanoparticles corresponding to a catalyst material for the electroless plating, dispersed in tetrahydrofuran in a concentration of 1.0% by weight.

In this Example, an alignment mark was formed on the substrate 40 in advance, and the alignment accuracy in the printing was evaluated. In the printing step, as shown in FIG. 10, in the stage for fixing and pushing the flat blanket 1, an apparatus having a control mechanism for the X, Y, θ coordinates and a parallel control mechanism was used. A spacer kept the flat blanket 1 and the substrate 40 parallel, and the flat blanket 1 and the substrate 40 were aligned while keeping them parallel and maintaining a gap of 50 µm. A specific alignment was performed in such a manner that the alignment mark preformed on the substrate 40 and the alignment mark formed on the flat blanket 1 in the first transfer step (FIG. 1B) were put together. The alignment accuracy measured after the second transfer step (FIG. 2A) was within ±0.5 µm.

In this Example, as shown in FIG. 2C, the substrate 40 was subjected to UV ozone treatment to decompose organic substances contained in the ink 2A, so that the ink fully exhibited catalytic activity in the electroless plating.

In this Example, the substrate 40 thus prepared was subjected to Ni electroless plating. As an electroless plating solution, TOP NICORON RD, manufactured and sold by Okuno Chemical Industries Co., Ltd., was used. Thus, an Ni wiring composed of an Ni thin film having a thickness of 300 nm was formed. The wiring had a fineness of 3 µm/3 µm in terms of a line/space.

Hereinabove, the present invention is described with reference to the embodiments and Examples, but the present invention is not limited to these embodiments and Examples, and can be changed or modified.

For example, in the above embodiments and Examples, an example is described in which the metal thin film 42 of a single layer is formed by electroless plating, but the metal thin film may be composed of a multilayer film formed by performing the electroless plating two or more times. By virtue of having a multilayer structure, the metal thin film may be improved in corrosion resistance, electric properties, wettability, and the like, making it possible to form a metal thin film having desired properties.

The metal thin film formed by embodiments of the present invention may be applied to an electronic device using a metal electrode (e.g., thin film transistor or capacitor).

Further, with respect to the materials for and thicknesses of the individual constituents and the deposition methods and deposition conditions and others described in the embodiments and Examples, there is no particular limitation, and other materials and thicknesses and other deposition methods and deposition conditions can be used.

In the method for producing a metal thin film according to an embodiment of the present invention, the substrate to which the ink including a catalyst material has been transferred is subjected to electroless plating, so that a metal thin film can be selectively formed on the substrate in a region to which the ink is transferred. The ink is transferred using a flat blanket, and further the substrate and the flat blanket are in contact by pressure compression in the transfer step. Consequently, the letterpress or substrate and the blanket are easy to align and the whole pressure for the contact of them is uniform, thereby improving the yield in producing a thin film. Further, the ink does not contain a material for the metal thin film but a catalyst material for the electroless plating. Accordingly, the metal thin film has a low resistance and the pattern can be easily scaled down, as compared to those obtained in a known method. Thus, a finer pattern and a higher yield than those obtained by a known method can be achieved without unnecessarily increasing the resistance of the thin film.

What is claimed is:

1. A transfer apparatus for producing a thin film pattern on a substrate, the transfer apparatus comprising:
    a first stage;
    a flat blanket fixed to the first stage, the flat blanket comprising a flexible layer and a rigid base, the rigid base rigidly supporting the flexible layer, wherein the rigid base has a thickness of about 10 to 500 microns and the flexible layer has a thickness of 1 to 5000 microns;
    an ink disposed on a surface of the flat blanket;
    a second stage located opposite the first stage;
    a letterpress fixed to the second stage;
    a fixation portion to fix the outer edge of the flat blanket on the first stage;
    wherein the first stage includes an opening adapted for compressed air-injection toward the flat blanket for pushing the flat blanket against the letterpress.

2. A transfer apparatus according to claim 1, wherein the fixation portion is a means for fixing the outer edge of the flat blanket on the first stage.

3. A transfer apparatus according to claim 1, wherein the fixation portion comprises a plurality of openings within the first stage for vacuum evacuation of an outer area peripheral to the opening for compressed air injection.

4. A transfer apparatus according to claim 1, wherein compressed air is supplied through the opening for compressed air injection during while the flat blanket is fixed on the first stage by the fixation portion.

5. A transfer apparatus according to claim 1, wherein the fixation portion comprises a stationary frame for fixing the flat blanket to the first stage.

6. A transfer apparatus according to claim 5, wherein the stationary frame comprises an O-ring.

7. A transfer apparatus according to claim 1, wherein the fixation portion is a part of the first stage with the opening for compressed air injection, and the flat blanket is fixed on the first stage by vacuum evacuation through a plurality of openings.

8. A transfer apparatus according to claim 1 further comprising an alignment microscope for aligning the letterpress and the flat blanket.

9. A transfer apparatus according to claim 8 wherein the alignment microscope has a multifocal alignment mechanism.

10. A transfer apparatus according to claim 1, wherein a pressure generated by the injected compressed air comprises between about 0.1 to 100 kPa.

11. A transfer apparatus according to claim 1, further comprising a space defined by the first stage and the flat blanket.

12. A transfer apparatus according to claim 1, wherein a portion of the outer edge of the flat blanket is offset from and is aligned substantially parallel with a central portion of the flat blanket.

13. A transfer apparatus according to claim 1, wherein the fixation portion is constructed and arranged to fix an outer edge of the flexible layer of the flat blanket and an outer edge of the rigid base of the flat blanket.

* * * * *